(12) United States Patent
Molchanov et al.

(10) Patent No.: US 8,553,503 B2
(45) Date of Patent: Oct. 8, 2013

(54) ON-DIE SIGNAL TIMING MEASUREMENT

(75) Inventors: Igor V. Molchanov, Hillsboro, OR (US); Matthew W. Heath, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 1041 days.

(21) Appl. No.: 12/347,884

(22) Filed: Dec. 31, 2008

(65) Prior Publication Data

US 2010/0164476 A1 Jul. 1, 2010

(51) Int. Cl.
*G01R 13/02* (2006.01)

(52) U.S. Cl.
USPC .................. 368/120; 324/76.82; 327/161

(58) Field of Classification Search
USPC .................. 368/120; 324/76.82; 327/161
See application file for complete search history.

(56) References Cited

U.S. PATENT DOCUMENTS

| | | | |
|---|---|---|---|
| 5,331,294 A * | 7/1994 | Watanabe et al. | 331/57 |
| 6,069,849 A * | 5/2000 | Kingsley et al. | 368/113 |
| 6,219,305 B1 * | 4/2001 | Patrie et al. | 368/113 |
| 6,232,845 B1 * | 5/2001 | Kingsley et al. | 331/57 |
| 6,233,205 B1 * | 5/2001 | Wells et al. | 368/118 |
| 6,356,514 B1 * | 3/2002 | Wells et al. | 368/113 |
| 6,757,054 B2 * | 6/2004 | Watanabe et al. | 356/5.1 |
| 6,771,103 B2 * | 8/2004 | Watanabe et al. | 327/161 |
| 6,812,799 B2 * | 11/2004 | Kirsch | 331/57 |
| 7,728,751 B2 * | 6/2010 | Watson et al. | 341/161 |
| 2004/0041606 A1 * | 3/2004 | Kirsch | 327/161 |
| 2004/0145423 A1 * | 7/2004 | Kirsch | 331/57 |
| 2007/0096836 A1 * | 5/2007 | Lee et al. | 331/57 |

OTHER PUBLICATIONS

Franch, R., P. Restle, N. James, W. Huott, J. Friedrich, R. Dixon, S. Weitzel, K. Van Goor, and G Salem, "On-Chip Timing Uncertainty Measurements on IBM Microprocessors", IEEE International Test Conference, Oct. 2007, pp. 1-7.
Metra, C., M. Omana, T.M. Mak, A.Rahman, and S. Tam, "Novel On-Chip Clock Jitter Measurement Scheme for High Performance Microprocessors", Proceedings of the 2008 IEEE International Symposium on Defect and Fault Tolerance of VLSI Systems, 2008, pp. 465-473.

* cited by examiner

*Primary Examiner* — Sean Kayes
(74) *Attorney, Agent, or Firm* — Konrad Raynes Davda & Victor LLP

(57) ABSTRACT

In one embodiment, a timing relationship between two signals on an integrated circuit is measured using a ring oscillator on the die of the integrated circuit. The measured time difference is outputted in a digital form. A delay line coupled to the ring oscillator may be used to reduce uncertainty in measurement which may result from the effects of latch circuit metastability. Other embodiments are described and claimed.

20 Claims, 5 Drawing Sheets

| # | Ring Osc RO<0:6> | | | | | | | Delay Line DL<0:4> | | | | | Comments |
|---|---|---|---|---|---|---|---|---|---|---|---|---|---|
| | 0 | 1 | 2 | 3 | 4 | 5 | 6 | 0 | 1 | 2 | 3 | 4 | |
| 1 | 1 | 0 | 1 | 0 | 0 | 1 | 0 | 1 | 0 | 1 | 0 | 0 | Ideal - No metastability, switching (edge) is between stages 3 and 4 of RO. |
| 2 | 1 | 0 | 1 | 1/0 | 1/0 | 1 | 0 | 1 | 0 | 1 | 1/0 | 1/0 | The same as #1, but with metastability, edge is between stages 2 and 5 of RO. |
| 3 | 1/0 | 0 | 1 | 0 | 1 | 0 | 1/0 | 1/0 | 0 | 1 | 0 | 1 | Metastability, edge is between stages 5 and 1 of RO. |
| 4 | 1/0 | 1/0 | 1 | 0 | 1 | 0 | 1 | 1/0 | 1/0 | 1 | 0 | 1 | Metastability, edge is between stages 6 and 2 of RO. |

| # | Ring Osc RO<0:6> | | | | | | | Delay Line DL<0:4> | | | | | Phase/Comments |
|---|---|---|---|---|---|---|---|---|---|---|---|---|---|
| | 0 | 1 | 2 | 3 | 4 | 5 | 6 | 0 | 1 | 2 | 3 | 4 | |
| 1 | 1 | 0 | 1 | 0 | 1 | 0 | 1 | 0 | 1 | 0 | 1 | 0 | = 0; just after circuit initialization |
| 2 | 0 | 0 | 1 | 0 | 1 | 0 | 1 | 0 | 1 | 0 | 1 | 0 | = 1; 1st RO cycle |
| 3 | 0 | 1 | 1 | 0 | 1 | 0 | 1 | 0 | 1 | 0 | 1 | 0 | = 2; 1st RO cycle |
| 4 | 0 | 1 | 0 | 0 | 1 | 0 | 1 | 0 | 1 | 0 | 1 | 0 | = 3; 1st RO cycle |
| 5 | 0 | 1 | 0 | 1 | 1 | 0 | 1 | 0 | 1 | 0 | 1 | 0 | = 4; 1st RO cycle |
| 6 | 0 | 1 | 0 | 1 | 0 | 0 | 1 | 0 | 1 | 0 | 1 | 0 | = 5 |
| 7 | 0 | 1 | 0 | 1 | 0 | 0 | 1 | 0 | 1 | 0 | 1 | 0 | = 6 |
| 8 | 0 | 1 | 0 | 1 | 0 | 1 | 0 | 0 | 1 | 0 | 1 | 0 | = 7 |
| 9 | 1 | 1 | 0 | 1 | 0 | 1 | 0 | 1 | 1 | 0 | 1 | 0 | = 8 |
| 10 | 1 | 0 | 0 | 1 | 0 | 1 | 0 | 1 | 0 | 0 | 1 | 0 | = 9 |
| 11 | 1 | 0 | 1 | 1 | 0 | 1 | 0 | 1 | 0 | 1 | 1 | 0 | = 10 |
| 12 | 1 | 0 | 1 | 0 | 0 | 1 | 0 | 1 | 0 | 1 | 0 | 0 | = 11 |
| 13 | 1 | 0 | 1 | 0 | 1 | 1 | 0 | 1 | 0 | 1 | 0 | 1 | = 12 |
| 14 | 1 | 0 | 1 | 0 | 1 | 0 | 0 | 1 | 0 | 1 | 0 | 1 | = 13 |
| 15 | 1 | 0 | 1 | 0 | 1 | 0 | 1 | 1 | 0 | 1 | 0 | 1 | = 0 |
| 16 | 0 | 0 | 1 | 0 | 1 | 0 | 1 | 0 | 0 | 1 | 0 | 1 | = 1 |
| 17 | 0 | 1 | 1 | 0 | 1 | 0 | 1 | 0 | 1 | 1 | 0 | 1 | = 2 |
| 18 | 0 | 1 | 0 | 0 | 1 | 0 | 1 | 0 | 1 | 0 | 0 | 1 | = 3 |
| 19 | 0 | 1 | 0 | 1 | 1 | 0 | 1 | 0 | 1 | 0 | 1 | 1 | = 4 |
| 20 | 0 | 1 | 0 | 1 | 0 | 0 | 1 | 0 | 1 | 0 | 1 | 0 | = 5 |

ON-DIE SIGNAL TIMING MEASUREMENT

BACKGROUND

Integrated circuits frequently contain multiple clock domains whose clocks are generated from different reference clock input pins. Where the relative phases of the domain clocks and the reference clocks are not controlled, the clocks are asynchronous. Transitions on signals which cross between asynchronous clock domains may be received on random clock cycles, which can lead to digital behavior which, while correct (conforming to the specification for the design), may be nondeterministic (that is, not predictable or easily repeatable). Nondeterminism can be detrimental to silicon debug and manufacturing test techniques employing test equipment which stores a unique expected response for each input test pattern. Fault-free dice which produce a response which is correct but which differs from the stored expected response may be rejected, leading to unnecessary yield loss. Tests which are designed to be insensitive to nondeterminism often have lower quality, which can lead to faulty dice which are not rejected by the test and thus can reduce outgoing product quality. One approach is to enforce deterministic behavior by controlling the relative timing of the edges of the clocks during testing. Historically, it has been relatively easy to devise reference clock timings that achieve determinism across a range of process, voltage, and temperature variations. However, it is believed that such clock alignments are becoming relatively more difficult to achieve reliably due to increasing clock frequencies and process technology advances, which can increase the variability of the device characteristics and reduce the accuracy of pre-silicon simulation.

Existing techniques for characterizing the timing relationship between two internal signals, such as two clock signals or a clock and a data signal, for example, are increasingly insufficiently accurate to facilitate post-silicon debug operations or are increasingly insufficiently rapid for testing during manufacturing. As a result, design or manufacturing efficiency may be adversely affected.

One example of a presently used signal measurement technique uses laser voltage probing. Such laser probe measurements can consume several days and involve chip de-cap or special fine silicon preparation, which can potentially change or even destroy circuit behavior. This technique is frequently not readily repeatable on a large sample population of products.

Domain-crossing signals may also be observed through an external interface. However, systematic and random delay mismatches in the internal multiplexer tree and input/output circuitry through which the signals pass en route to the external interface may make the relative timing between the signals at the chip pins differ substantially from that at the sources of the signals, limiting the resolution or accuracy of the technique.

Yet another approach is the use of a characterization test which is specifically designed to pass when the internal signals are properly aligned and fail when they are not. With this technique, there is the possibility that a phenomenon not related to the clock domain crossings can influence the observed results. This method typically does not provide actual skew measurements for domain-crossing signals, but merely a passing region of skew control settings instead.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1:
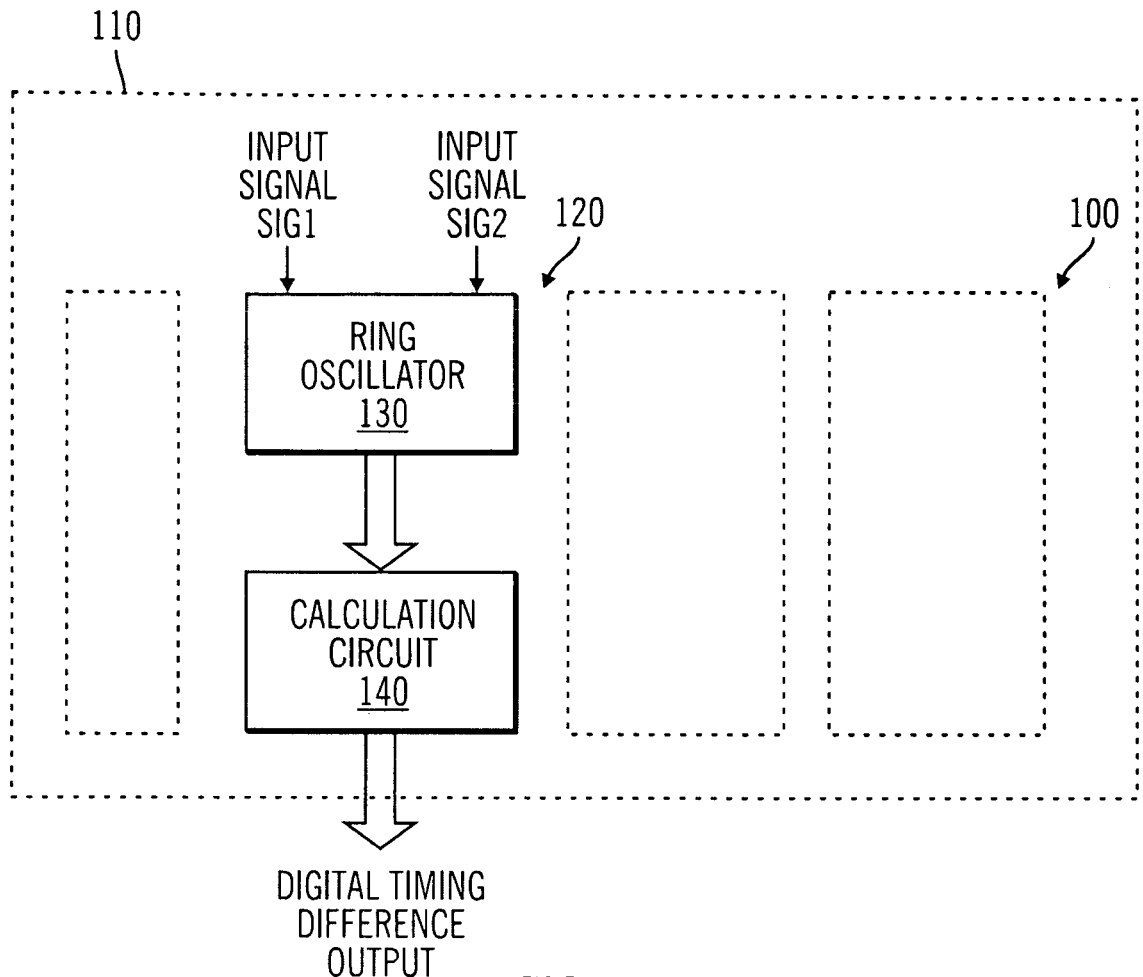
FIG. 1 illustrates one embodiment of an integrated circuit in which aspects of the description provided herein are embodied.

FIG. 1 shows one example of an integrated circuit 100 on a die 110 in accordance with one embodiment of the present description. The integrated circuit may perform any of a variety of functions including those of a processor, controller, input/output device, etc. The integrated circuit 100 includes a timing measurement circuit 120 onboard the die 110. As described in greater detail below, the timing measurement circuit 120 is adapted to measure the timing relationship between two signals on the integrated circuit, such as sig1 and sig2, for example. The signals sig1 and sig2 may be generated by circuitry of the integrated circuit 100 or may be input from external sources.

In the illustrated embodiment, the timing measurement circuit 120 includes a ring oscillator 130 which is adapted to measure a time difference or skew between transitions (such as the rising edge) of two signals such as sig1 and sig2 on the integrated circuit 100. Alternatively, the falling edges of the two signals may be used. A calculation circuit 140 coupled to the output of the ring oscillator 130 is adapted to output the time difference measured by the ring oscillator 130 in a digital form. A start/stop circuit 132 generates enable/disable (start/stop) signals for the ring oscillator 130 and the calculation circuit 140. In one application, the calculation circuit 140 counts the cycles of a calibrated, high frequency ring oscillator 130 during a timing measurement interval, and also captures the internal states of the ring oscillator 130 at the end of the timing measurement interval. Such an arrangement is believed to be capable of providing accurate on-die time interval measurements that can be readily observed external to the integrated circuit chip. Furthermore, it is believed that the measurements may be obtained relatively quickly to facilitate circuit design during post-silicon debugging or testing during high volume circuit manufacturing, for example. It is appreciated of course that other uses or advantages may be provided in addition to or instead of those discussed herein, depending upon the particular application.

Figure 2:
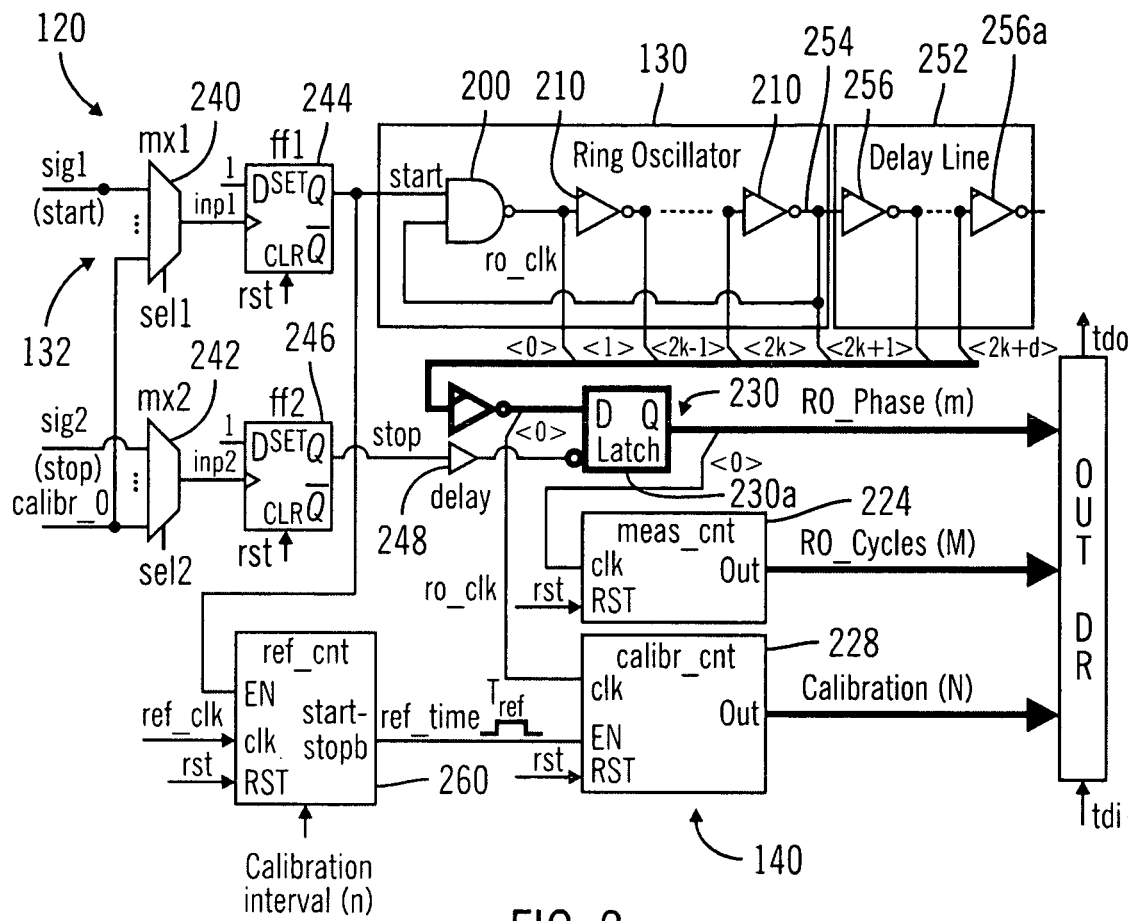
FIG. 2 is a more detailed schematic diagram of a timing measurement circuit of the integrated circuit of FIG. 1.

FIG. 2 shows a more detailed example of one embodiment of a timing measurement circuit 120 in accordance with the present description. In this embodiment, the ring oscillator 130 has a plurality of stages where the number of stages may vary as represented by the variable (2k+1). In one embodiment, the number of ring oscillator stages may be odd as indicated the variable (2k+1). It is appreciated that in other applications, an even number may be appropriate. A first stage of the oscillator ring 130 comprises a NAND gate 200 which functions as an inverter when the input signal start is high. The remaining stages each include an inverter 210. The stages are connected in a ring with the output of one stage connected to the input of the next stage in the ring. In one embodiment, the stages may be designed to have substantially equal delays. It is believed that such delay matching may be achieved by appropriate selection of circuit parameters and matched layout implementation. It is appreciated that in other embodiments, the delays of the stages may differ, depending upon the particular application. The ring oscillator 130 is enabled by the first transition or edge (sig1:edge0, FIG. 3) of the first signal sig1 defining the beginning of the timing interval of interest. Cycles of the ring oscillator 130 are counted during this timing measurement interval by a measurement counter (meas_cnt) 224 and during a calibration or reference time interval by a calibration counter (calibr_cnt) 228 of the calculation circuit 140.

The measurement counter 224 increments during the timing measurement interval between the edge (sig1:edge0, FIG. 3) of sig1 and the same transition or edge (sig2:edge0, FIG. 3) of sig2. The clock (clk) for the measurement counter 224 stops toggling when the edge (sig2:edge0, FIG. 3) of sig2 occurs. The output of the measurement counter 224 which is a count of the ring oscillator cycles during the timing measurement interval (indicated as RO_Cycles (M) in FIG. 2) keeps its count value until the result is read and the circuit is re-initialized.

In the illustrated embodiment, to provide a measurement resolution more fine than the period of the ring oscillator 130, calculation circuit 140 performs a "snapshot" of the states of the outputs of all the stages of the ring oscillator 130 at the moment of the measurement completion, that is, at the end of the timing measurement interval. To perform the snapshot, the outputs of all the oscillator stages are routed to the inputs of latches 230. In one embodiment, a latch is provided for each ring oscillator stage, an example of which is illustrated by a latch 230a coupled to the output of the stage 200. Latches (not separately drawn) may be provided for the other stages of the ring oscillator 130. The latches 230 capture the states of the stages of the ring oscillator 130 when the edge of sig2 arrives and are otherwise transparent during the timing measurement interval. In a manner similar to that described above in connection with the ring oscillator stages, in one embodiment, the signal paths from the outputs of the ring oscillator stages to the inputs of the latches may be designed to have substantially equal delays. It is believed that such delay matching may be achieved by appropriate selection of circuit parameters and matched layout implementation. It is appreciated that in other embodiments, the delays of the signal paths may differ, depending upon the particular application.

The output of the latch 230a corresponds to the output (RO_Phase 0) of the first stage of the ring oscillator 130 and is used for counting an integer number of ring oscillator cycles. In the illustrated embodiment, the output of the latch 230a is used as a clock (clk) for the measurement counter 224.

Figure 3:
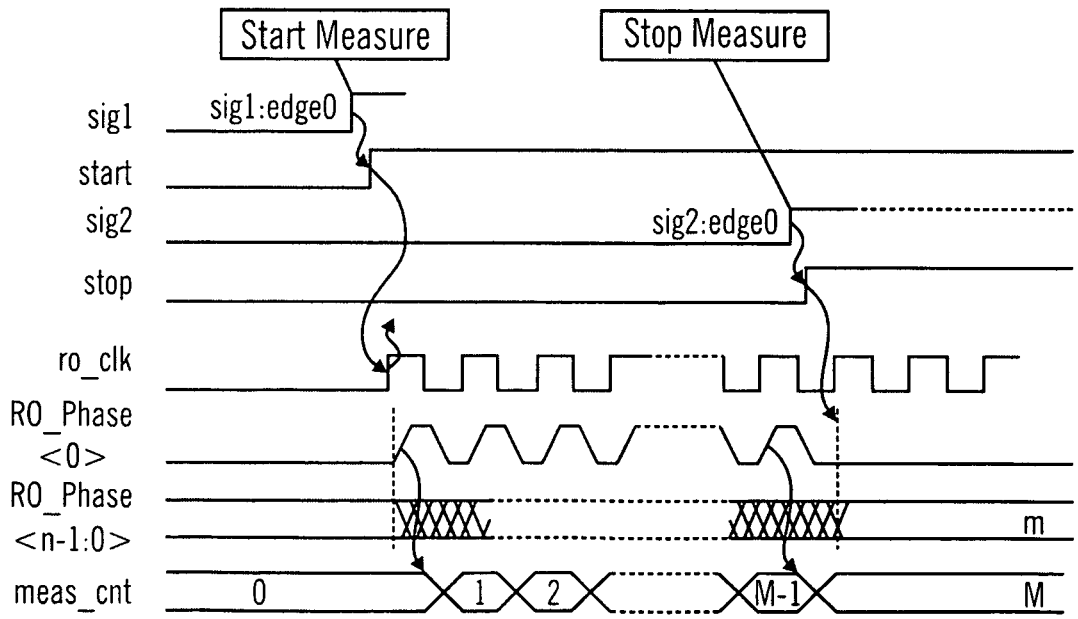
FIG. 3 illustrates a timing diagram of a measurement operation of the timing measurement circuit of FIG. 2.

Also in this example, the start/stop circuit 132 which generates enable/disable (start/stop) signals for the ring oscillator 130 and the calculation circuit 140, includes input multiplexers (mx1, mx2), 240, 242 which may be used for selection of different signal pairs and polarities (inverted signals) for start and stop triggers if necessary. FIG. 3 shows the start trigger signal (start) delayed somewhat from the edge (sig1:edge0) of the first signal sig1 by the input multiplexer 240 (FIG. 2) and a flip-flop (ff1) 244 which is clocked by the output of the multiplexer 240. In a similar manner, the stop trigger signal (stop) is delayed from the edge (sig2:edge0) of the second input signal sig2 by the input multiplexer 242 (FIG. 2) and a flip-flop (ff2) 246 which is clocked by the output of the multiplexer 242. A further delay 248 in the path of the stop signal may be provided in some embodiments to facilitate ensuring that the capture of the ring oscillator stage outputs does not occur before the ring oscillator 130 is enabled. Such a delay may be of particular applicability in those applications in which the stop path may be faster than start path due to the particular circuit implementation or a variation in the process used for fabrication of the integrated circuit. In addition, close to zero or even negative timing such as where sig2 appears before sig1, may also be performed.

In one embodiment, the same signal, such as the signal (calibr_0) may be input to both input multiplexers 240, 242 to provide mutual calibration of the two input signal paths for sig1 and sig2. For example, the actual delay from the input signal to its associated start or stop trigger signal may be measured. In this manner, the timing difference between start and stop signal paths may be measured. The aforementioned delay buffer 248 can ensure a non-zero value as a result of that measurement. The actual measured value of the difference between the input signals being measured, may be adjusted based on the measured timing difference between the start and stop signal paths to calculate the final accurate result.

The timing measurement circuit 120 may be initialized or enabled with the reset signal rst applied to the counters, flip-flops and other circuitry. Initialization, enablement and programming may be provided through a suitable test access port. For many applications, it may be appropriate to use a synchronized version of the initialization signal (rst) in which rst is synchronized by the input signal such as sig1.

It is appreciated that due to the nature of a ring oscillator, there may be a stage which is switching output states at the end of the timing measurement interval. As a consequence, there may be some uncertainty as to one or more of the values of the captured states of the ring oscillator stages. To facilitate a reduction in uncertainty of the output states, and in accordance with another aspect of the present description, the timing measurement circuit 120 further includes a delay line 252, which in the illustrated embodiment, is coupled to the output 254 of the last stage of the ring oscillator.

The delay line 252 has a plurality of stages where the number of stages may vary as represented by the variables 2k+1 to 2k+d. The stages of the delay line 252 each include an inverter 256. In one embodiment, the delay of each stage of the delay line may be selected to match the delay of each stage of the ring oscillator. For example, the circuit elements and circuit layout used for each stage of the ring oscillator may also be used for each stage of the delay line. It is appreciated that in other embodiments, other circuit elements, layouts and delays may be selected for the delay line, depending upon the particular application. The stages are connected in a line with the output of one stage connected to the input of the next stage in the line. Unlike the ring oscillator 130 the output of the last stage 256a of the delay line 252 is not coupled to the input of the first stage of the delay line 252 in the illustrated embodiment. However, in one embodiment, the last stage 256a may be loaded with a capacitance, which may be equivalent to the loading of each of the other stages of the delay line to match the loading of the previous stage. Here too, it is appreciated that in other embodiments, the loading of the stages may vary, depending upon the particular application. In one example, the number d of stages of the delay line may match the number 2k+1 of stages of the ring oscillator 130. It is appreciated that the number of stages of the ring oscillator or delay line may vary, depending upon the particular application.

In the illustrated embodiment, the calculation circuit 140 performs a "snapshot" of the states of the outputs of all the stages of the delay line 252 at the moment of the measurement completion, that is, at the end of the measurement interval, in a manner similar to that of the ring oscillator 130. To perform the snapshot of the delay line, the outputs of all the delay line stages are routed to the inputs of latches 230 similar to the latch 230a depicted for the first stage of the ring oscillator. In one embodiment, a latch 230 is provided for each delay line stage. In a manner similar to that described above in connection with the ring oscillator stages, in one embodiment, the signal paths from the outputs of the delay stages to the inputs of the latches may be designed to have substantially equal delays. As a result, the delays of each stage of the ring oscillator and the delay line may be substantially equal to each other and the delays of the signal paths from the outputs of the stages to the latches may be substantially equal to each other. It is believed that such delay matching may be achieved by appropriate selection of circuit parameters and matched layout implementation. It is appreciated that in other embodiments, the delays of the stages and signal paths may differ, depending upon the particular application. The latches 230 capture the states of the stages of the ring oscillator 130 and the delay line 252 when the edge of sig2 arrives and are otherwise transparent during the timing measurement interval.

In this manner, the delay line 252 provides more bits of information in the result of the timing measurement and thus may increase the reliability of the measurement in some applications. As noted above, the output 254 of the last stage of the ring oscillator 130 feeds the first stage of the delay line 252, which is matched with the inverter chain of ring oscillator. The total number of captured output states of the stages of both the ring oscillator 130 and the delay line 252 may be selected to provide two switching edges in the latched data. One captured switching edge represents the position of the change propagating through the stages of the ring oscillator 130 at the end of the timing measurement interval. The other captured switching edge represents the position of the change propagating through the stages of the delay line 252 at the end of the timing measurement interval. As explained in greater detail below, the two captured switching edges facilitate determining a possible range of ring oscillator stage output phases even if there is some uncertainty in the values of some bits of the captured result.

Figures 4, 5:
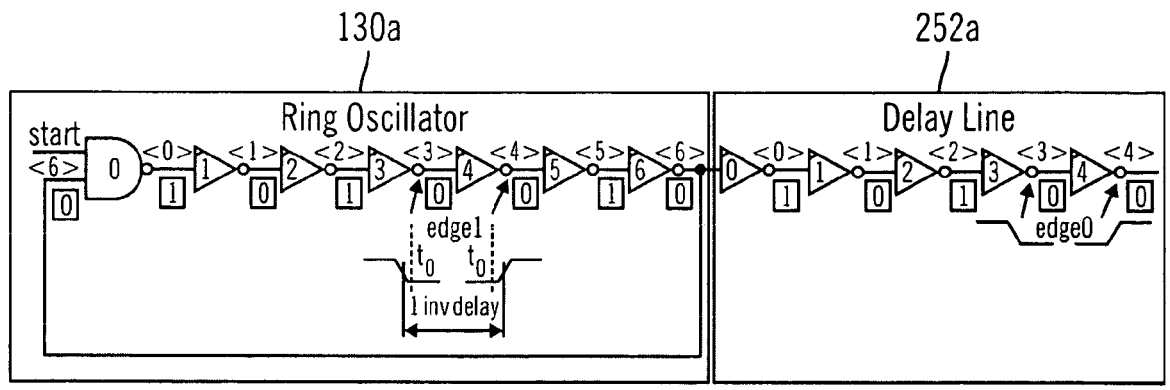
FIG. 4 illustrates an example of switching edge propagation through a ring oscillator and a delay line of the timing measurement circuit of FIG. 2.
FIG. 5 is a table of examples of possible captured states of a ring oscillator and a delay line of the timing measurement circuit of FIG. 2.

A possible impact of latch circuit metastability on the captured ring oscillator stage output data is illustrated in FIG. 4. In this example, the ring oscillator 130 is shown greatly simplified as a 7-stage ring oscillator 130a, and the delay line 252 as a 5-stage delay line 252a. The output of each stage is coupled to a latch (not shown) which can exhibit a 2-gate-delay setup-hold metastability latching interval, for example.

It is appreciated that with respect to the ring oscillator alone, it may be difficult in some applications to distinguish between uncertain bits and correct bits in the captured result. Such difficulty may be enhanced where there are relatively fewer stages in the ring oscillator and a longer interval of metastability in the latch. In accordance with the present description, addition of the matched delay line is believed to ameliorate such difficulty by having two consecutive switching edges in the captured data. It is appreciated that a 5 stage delay line may not provide for capturing 2 edges for all possible edge locations inside the ring oscillator. However, a 5 stage delay line is discussed as an example for purposes of clarity.

FIG. 4 illustrates one such switching edge located between stages 3 and 4 of the ring oscillator 130a. As indicated by example #1 in FIG. 5 which depicts the outputs of the sampling latches 230 for each stage of the ring oscillator 130a in the ideal circumstance, that is, no impact of latch circuit metastability, in which the outputs of both stages 3 and 4 of the ring oscillator 130a are correctly latched by the latches 230 as 0, 0, respectively, in this example. Similarly, in the ideal circumstance, that is, no impact of latch circuit metastability, the outputs of both stages 3 and 4 of the delay line 232a are correctly latched by the latches 230 as 0, 0, respectively, in this example.

Example #2 in FIG. 5 depicts the output of each stage of the ring oscillator 130a in the same situation as example #1 except that due to the impact of latch circuit metastability, one or both of the outputs of both stages 3 and 4 of the ring oscillator 130a may be not be captured correctly (as indicated by "1/0" indicating that the output may be either a 1 or a 0), in this example. Similarly, due to the impact of latch circuit metastability, one or both of the outputs of both stages 3 and 4 of the delay line 232a may also not be captured correctly, in this example. As result of the impact of latch circuit metastability, the switching edge and hence the phase of the ring oscillator may be more difficult to locate with precision when examining only the latched output stages of the ring oscillator stages. Thus, in example #2, the latched output data may indicate that the switching edge is between stages 2 and 5 of the ring oscillator. Examples #3 and #4 show examples in which the latched output data may indicate that the switching edge is between stages 5 and 1 (example #3) or between stages 6 and 2 (example #4).

However, in accordance with the present description, by adding the delay line 252a and latching the outputs of its stages when the outputs of the stages of the ring oscillator are latched, additional information is provided which can resolve ambiguities presented by incorrect data capture in some applications. For example, it is believed that the phase of the ring oscillator, that is the location of the switching edge at the end of the measurement interval may be better understood when considering a few factors. One such factor is that the signal phase is changed around the edge, i.e. bit<i>==bit<i+2*j+1>, j may be 0, 1, . . . (some first numbers may not be particularly helpful due to the impact of latch circuit metastability). The ideal case is when j=0. In addition, in the illustrated embodiment, the edge to edge distance between the captured edge1 in the ring oscillator 130a and the captured edge0 of the delay line 252a of FIG. 4 is expected to be equal to the number of inverting stages in the ring oscillator 130a in the ideal conditions, that is no impact of latch circuit metastability. Thus in this example, the edge to edge distance between edges edge1 and edge0 is 7, the number of stages of the ring oscillator 130a. However, due to the possible impact of latch circuit metastability which may result from a number of factors including variations in circuit implementation or processes, or variations or mismatches in environmental conditions including voltage, temperature, etc.

Another factor which may be considered in evaluating the captured data is that between edges, the consecutive bits of captured data contain 10101 or 01010 patterns (taking in to account possible impact of latch circuit metastability). FIG. 5 shows an example of a conversion table for converting captured data into a ring oscillator phase number which identifies the location of the switching edge in the ring oscillator. FIG. 5 shows the expected captured data for ideal conditions, that is, without impact of latch circuit metastability. In the event captured data is not captured correctly due to the impact of latch circuit metastability, it is believed that the ring oscillator phase may yet be accurately determined in a number of applications by considering the factors discussed above.

Figures 6, 7:
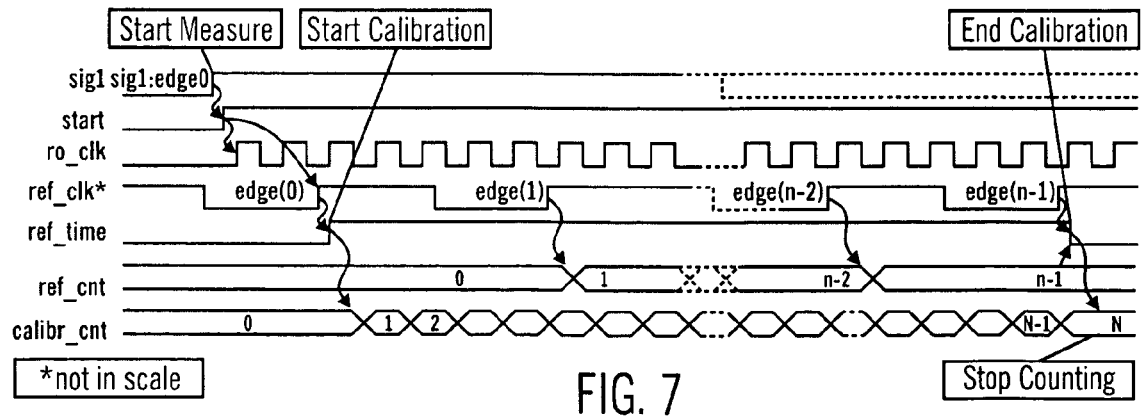
FIG. 6 illustrates an example of a conversion table for converting captured states of a ring oscillator and a delay line of the timing measurement circuit of FIG. 2 to a phase value of the ring oscillator.
FIG. 7 illustrates a timing diagram of a calibration operation of the timing measurement circuit of FIG. 2.

The timing measurement circuit 120 may be calibrated using a calibration or reference time interval (ref_time, FIG. 7) which may be defined based on a predetermined number of periods of a known frequency of a known signal, referred to herein as the reference clock (ref_clk). The predetermined number of periods may be programmed into a reference counter (ref_cnt) 260 (FIG. 2). The calibration counter 228 is clocked by a clock signal ro_clk which switches each cycle of the ring oscillator as indicated by the output of the first stage of the ring oscillator. In this manner, the calibration counter 228 increments each ring oscillator cycle during the reference time interval until a predetermined programmed value of the reference counter 260 is achieved marking the end of the reference time interval. When the last edge (edge(n−1)) of the reference clock ref_clk edge arrives, counting of ring oscillator cycles by the calibration counter 228 is disabled as indicated by the calibration counter output calibr_cnt in FIG. 7. Accordingly, a measure of the reference time interval is provided by the count of ring oscillator cycles during the reference time interval.

The above described calibration may be performed concurrently with the measurement of the timing difference between input signals to reduce inaccuracies caused by the variation of the ring oscillator frequency over time due to changes in voltage or temperature. It is further appreciated that possible uncertainty of the counter values when the measurement and the calibration is stopped may be reduced by repeating measurement and calibration runs. In the illustrated embodiment, the calibration interval is measured with an accuracy on the order of the ring oscillator period. Accordingly, in some embodiments, it may be appropriate to have a calibration interval long enough to encompass many cycles of the ring oscillator. For example, 100 cycles of the ring oscillator may provide an accuracy of approximately 1% of the calculated ring oscillator. It is appreciated that the length of the calibration interval may vary, depending upon the particular application.

Measured data may be accessed through a suitable test or other port of the integrated circuit. A timing value t of interest (such as the timing difference between sig1-to-sig2) may be calculated as:

$$t = (M1 + m1/2K) * (n/N1) * 1/F$$

Where:
M1 is measured time value, units: number of ring oscillator cycles,
K is the number of inversion stages in the ring oscillator,
m1 is the actual ring oscillator phase, calculated or converted based on the captured states of the stages of the ring oscillator and the delay line, units: number of inversions, range 0-(2K−1),
N1 is the measured calibration value, units: number of ring oscillator cycles,
n is length of the calibration or reference time interval, units: number of reference frequency cycles, and
F is the frequency of the reference clock ref_clk.

The formula for conversion of counters values into the number of ring oscillator cycles (M to M1 and N to N1) may vary depending upon the particular implementation. The conversion of captured ring oscillator states into a ring oscillator phase value may be performed taking into account the possible uncertainty of this data due to metastability as described above.

Figure 8:
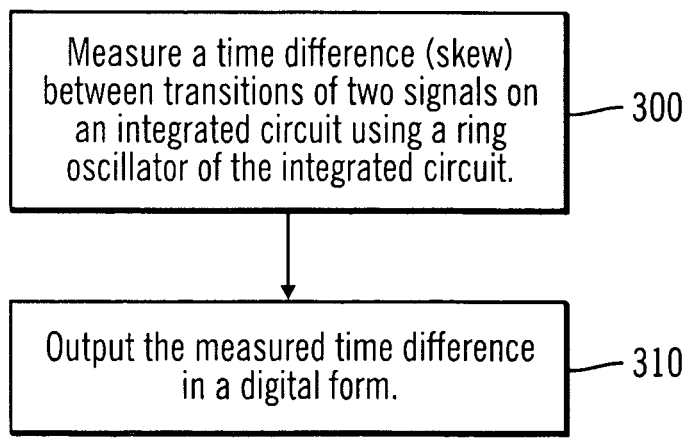
FIG. 8 illustrates one embodiment of measurement operations performed by a timing measurement circuit of the integrated circuit of FIG. 1.

FIG. 8 shows one example of operations to measure a timing relationship between two signals on an integrated circuit. In one operation, a time difference or skew between transitions (such as the rising edges) of the two signals on an integrated circuit is measured (block 300) in a digital form on the same integrated circuit using a ring oscillator such as the ring oscillator 130 of the integrated circuit 100. In another operation, the measured time difference is outputted (block 310) in a digital form.

In this example, the time difference measuring may include initiating a ring oscillator transition of an output such as the output ro_clk, of an entry stage 200 of a chain or line of stages 210 of the ring oscillator in response to a first signal such as the input signal sig1. In an alternative embodiment, the ring oscillator may be already oscillating when the first transition arrives, causing the outputs of the counters and the stages of the ring oscillator and the delay line (if provided) to be latched a first time. The ring oscillator transition propagates around the chain or line of stages 210 of the ring oscillator 130 back to the entry stage 200 of the ring oscillator. Each return of the ring oscillator transition to the entry stage 200 of the ring oscillator 130 defines a cycle of the ring oscillator. The output values of the stages of the ring oscillator (and the delay line if included) are captured in response to a second signal, sig2 in this example. In the described embodiment, the ring oscillator does not stop oscillating or toggling when the transition of the second signal, sig2, arrives. The ring oscillator may continue toggling to complete the calibration cycle. In the illustrated embodiment, the circuit reset signal (rst) stops the ring oscillator. It is appreciated that the ring oscillator may stop oscillating in response to the second signal transition in other embodiments.

Further in this example, the time difference measuring includes counting the cycles of the ring oscillator 130 during a timing measurement interval, which starts in response to a first transition (such as sig1:edge0) of the first signal sig1 and ends in response to a second transition (such as sig2:edge0) of the second signal sig2.

In another aspect, the time difference measuring further includes capturing the output states of the stages of the ring oscillator at the end of the timing measurement interval. The position of the ring oscillator transition among the captured output stages of the ring of stages of the ring oscillator indicating the phase of the ring oscillator, may be determined at the end of the timing measurement interval.

In yet another aspect, in response to the ring oscillator transition, a delay line transition may be propagated through a line of stages of a delay line coupled to the output of a stage of the ring oscillator. In addition, the output states of the line of stages of the delay line may be captured at the end of the timing measurement interval. The position of the delay line transition among the captured outputs of the line of stages of the delay line indicating the phase of the delay line and also the ring oscillator, may be determined at the end of the timing measurement interval.

In still another aspect, in determining the positions of the ring oscillator transition and the delay line transition, a determination may be made to distinguish between correctly captured and incorrectly captured states of the output stages of the ring oscillator and the delay line. In one embodiment, the distinguishing between correctly captured and incorrectly captured states may be a function of the expected distance between the ring oscillator transition and the delay line transition at the end of the measurement interval being equal to the number of stages of the ring oscillator. Moreover, the distinguishing between correctly captured and incorrectly captured states may also be a function of an expected pattern of the states of the captured stage outputs between the ring oscillator transition and the delay line transition at the end of the measurement interval.

The present description provides a measurement of the difference between internal clock domains (or between any two internal signals of interest) which is believed to be both direct and accurate. Depending upon the particular application, it is believed that the described measurement can simplify and accelerate test program set-up and post silicon (post-Si) debug, and can remove some uncertainties inherent to indirect methods. The described monitoring of internal clock relationships during high volume manufacturing testing for each chip is also believed to provide the capability of reducing complicated periodic re-characterization to track possible changes (for example, those resulting from processing updates).

In one application, the described measurements may be embodied in a digital implementation. As a result, it is believed that development may be simplified, and the range of measurement timing values may be extended. In addition to measuring the difference between two selected signals, the measurement may also be applied to measuring timing characteristics of a selected signal such as pulse width or period of the selected signal.

Additional Embodiment Details

The described techniques for measuring signal timing may be embodied as a method, apparatus or article of manufacture using standard programming and/or engineering techniques to produce software, firmware, hardware, or any combination thereof. The outputs of the on-die counters and latches may be processed by on-die logic circuitry, firmware or software or processed by off chip logic circuitry, firmware or software, or a combination thereof, to resolve uncertainty and to provide a numerical representation of the measured time difference. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The code in which preferred embodiments are embodied may further be accessible through a transmission media or from a file server over a network. The "article of manufacture" may comprise the medium in which the code is embodied. Additionally, the "article of manufacture" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, the timing measurement embodiments may be embodied in a computer system including a video controller to render information to display on a monitor coupled to the computer system including the device driver and network controller, such as a computer system comprising a desktop, workstation, server, mainframe, laptop, handheld computer, etc. Alternatively, the timing measurement circuit embodiments may be embodied in a computing device that does not include a video controller, such as a switch, router, etc.

The illustrated logic of FIG. 8 shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 9:
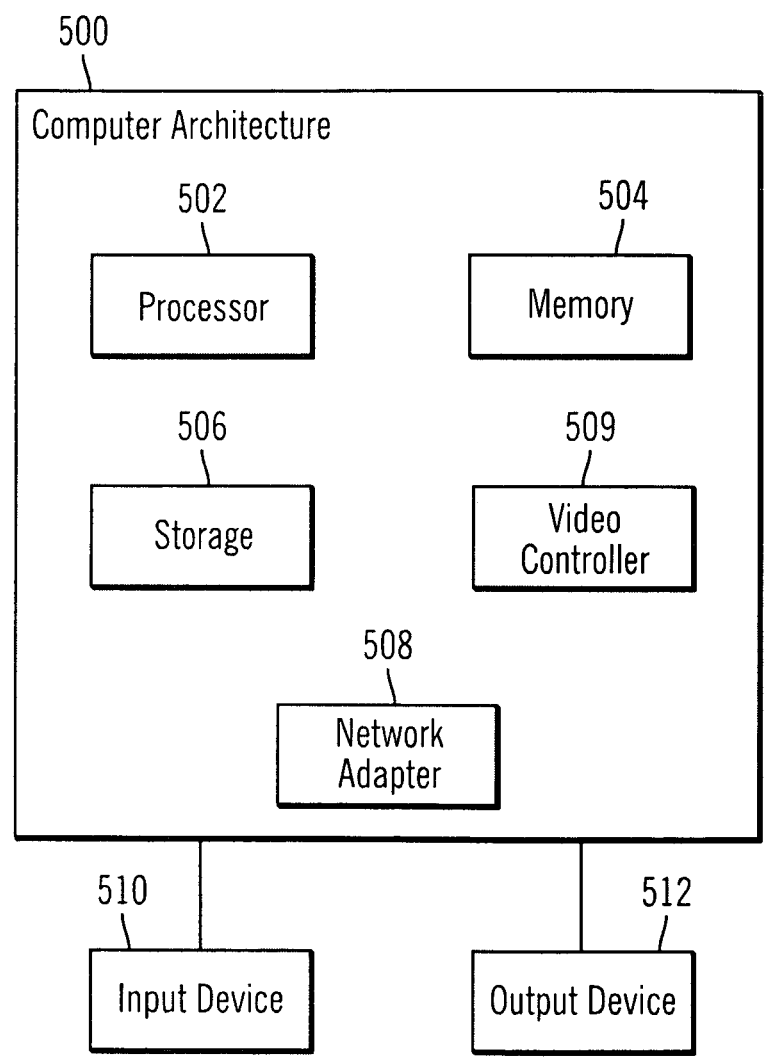
FIG. 9 illustrates an example of an architecture that may be used with the described embodiments.

FIG. 9 illustrates one embodiment of a computer architecture 500 of components, any one of which may include an integrated circuit in accordance with the present description. The computer architecture 500 may comprise any computing device known in the art, such as a mainframe, server, personal computer, workstation, laptop, handheld computer, telephony device, network appliance, virtualization device, storage controller, etc. The architecture 500 may include a processor 502 (e.g., a microprocessor), a memory 504 (e.g., a volatile memory device), and storage 506 (e.g., a non-volatile storage, such as magnetic disk drives, optical disk drives, a tape drive, etc.). The storage 506 may comprise an internal storage device or an attached or network accessible storage. Programs in the storage 506 are loaded into the memory 504 and executed by the processor 502 in a manner known in the art. The architecture further includes a network controller 508 to enable communication with a network, such as an Ethernet, a Fibre Channel Arbitrated Loop, etc. Further, the architecture may, in certain embodiments, include a video controller 509 to render information on a display monitor, where the video controller 509 may be embodied on a video card or integrated on integrated circuit components mounted on the motherboard. An input device 510 is used to provide user input to the processor 502, and may include a keyboard, mouse, pen-stylus, microphone, touch sensitive display screen, or any other activation or input mechanism known in the art. An output device 512 is capable of rendering information transmitted from the processor 502, or other component, such as a display monitor, printer, storage, etc.

The network controller 508 may embodied on a network card, such as a Peripheral Component Interconnect (PCI) card, PCI-express, or some other I/O card, or on integrated circuit components mounted on the motherboard. The storage 506 may comprise an internal storage device or an attached or network accessible storage. Programs in the storage 506 are loaded into the memory 504 and executed by the processor 502. Any one or more of the devices of the computer architecture 500 may include one or more integrated circuits having an on-die timing measurement circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A method, comprising:
   measuring a timing relationship between two signals on an integrated circuit, comprising:
   measuring a time difference between transitions of the two signals on an integrated circuit using a ring oscillator of said integrated circuit wherein said time difference measuring includes initiating a ring oscillator transition of an output of an entry stage of a ring of stages of the ring oscillator, propagating the ring oscillator transition around the ring of stages of the ring oscillator back to the entry stage of the ring oscillator and propagating in response to the ring oscillator transition, a delay line transition through a line of stages of a delay line receiving the output of the last stage of the ring oscillator wherein the stages of the delay line are connected in the line with the output of one stage connected to the input of the next stage in the line; and outputting the measured time difference in a digital form.

2. The method of claim 1 wherein each return of the ring oscillator transition to the entry stage of the ring oscillator defines a cycle of the ring oscillator, and wherein said time difference measuring includes counting the cycles of the ring oscillator during a measurement interval.

3. The method of claim 2 wherein said measurement interval starts in response to a transition of a first signal and ends in response to a transition of a second signal.

4. The method of claim 3 wherein said time difference measuring further includes capturing the output values of ring of stages of the ring oscillator at the end of said measurement interval.

5. The method of claim 4 wherein said time difference measuring further includes determining the position of the ring oscillator transition among the captured values of the output stages of the ring of stages of the ring oscillator at the end of said measurement interval.

6. The method of claim 5 wherein said time difference measuring further includes capturing the output values of the line of stages of said delay line at the end of said measurement interval.

7. The method of claim 6 wherein said time difference measuring further includes determining the position of the delay line transition among the captured values of the output stages of the line of stages of the delay line at the end of said measurement interval.

8. The method of claim 7 wherein said determining of the positions of the ring oscillator transition and the delay line transition include distinguishing between correctly captured and incorrectly captured values of the output stages of the ring oscillator and the delay line.

9. The method of claim 8 wherein said distinguishing is a function of the expected distance between the ring oscillator transition and the delay line transition at the end of said measurement interval being equal to the number of stages of the ring oscillator.

10. The method of claim 8 wherein said distinguishing is a function of an expected pattern of the values of the captured stage outputs between the ring oscillator transition and the delay line transition at the end of said measurement interval.

11. A device, comprising:
an integrated circuit on a die having an timing measurement circuit onboard said die and adapted to measure the timing relationship between two signals on said integrated circuit, said timing measurement circuit comprising:
a ring oscillator adapted to measure a time difference between transitions of the two signals on said integrated circuit, wherein said ring oscillator includes a ring of stages including an entry stage adapted to initiate a ring oscillator output transition in response, said ring of stages is adapted to propagate said ring oscillator transition around the ring of stages, and wherein said timing measurement circuit further comprises a delay line which includes a line of stages coupled to an output of the last stage of the ring oscillator and adapted to propagate in response to the ring oscillator transition, a delay line transition through the line of stages of the delay line wherein the stages of the delay line are connected in the line with the output of one stage connected to the input of the next stage in the line; and a calculation circuit coupled to the output of the ring oscillator and adapted to output data which is a function of the measured time difference of the ring oscillator in a digital form.

12. The device of claim 11 wherein said calculation circuit further comprises a counter coupled to the output of the entry stage of ring oscillator wherein the ring oscillator transition to the entry stage of the ring oscillator defines a cycle of the ring oscillator, said counter being adapted to count the cycles of the ring oscillator during a measurement interval.

13. The device of claim 12 wherein said measurement interval starts in response to a transition of a first signal and ends in response to a transition of second signal.

14. The device of claim 13 wherein said calculation circuit further comprises latches coupled to the outputs of the ring of stages of the ring oscillator and adapted to capture the output values of the ring of stages of the ring oscillator at the end of said measurement interval.

15. The device of claim 14 further comprising logic adapted to determine the position of the ring oscillator transition among the captured values of the output stages of the ring of stages of the ring oscillator at the end of said measurement interval.

16. The device of claim 15 wherein said calculation circuit further comprises latches coupled to the outputs of the line of stages of the delay line and adapted to capture the output values of the line of stages of said delay line at the end of said measurement interval.

17. The device of claim 16 wherein said logic is further adapted to determine the position of the delay line transition among the captured output values of the stages of the line of stages of the delay line at the end of said measurement interval.

18. The device of claim 17 wherein said logic is further adapted to distinguish between correctly captured and incorrectly captured values of the output stages of the ring oscillator and the delay line.

19. The device of claim 18 wherein said logic is adapted to distinguish between correctly captured and incorrectly captured values of the output stages of the ring oscillator and the delay line as a function of the expected distance between the ring oscillator transition and the delay line transition at the end of said measurement interval, being equal to the number of stages of the ring oscillator.

20. The device of claim 18 wherein said logic is adapted to distinguish between correctly captured and incorrectly captured values of the output stages of the ring oscillator and the delay line as a function of an expected pattern of the values of the captured stage outputs between the ring oscillator transition and the delay line transition at the end of said measurement interval.

* * * * *